United States Patent
Döhler et al.

(10) Patent No.: US 7,276,541 B2
(45) Date of Patent: Oct. 2, 2007

(54) USE OF HYDROXYL-FUNCTIONAL POLYALKYLORGANOSILOXANES AS SOLVENTS FOR CATIONIC PHOTOINITIATORS FOR USE IN RADIATION- CURABLE SILICONES

(75) Inventors: Hardi Döhler, Hattingen (DE); Sascha Oestreich, Essen (DE)

(73) Assignee: Goldschmidt AG, Essen (DE)

( * ) Notice: Subject to any disclaimer, the term of this patent is extended or adjusted under 35 U.S.C. 154(b) by 172 days.

(21) Appl. No.: 10/933,613

(22) Filed: Sep. 3, 2004

(65) Prior Publication Data
US 2005/0054769 A1 Mar. 10, 2005

(30) Foreign Application Priority Data
Sep. 6, 2003 (DE) ................. 103 41 137

(51) Int. Cl.
*C08F 2/50* (2006.01)
(52) U.S. Cl. .............. 522/31; 525/477; 525/476; 522/170; 522/172
(58) Field of Classification Search .......... 525/477, 525/476; 522/31, 170, 172
See application file for complete search history.

(56) References Cited

U.S. PATENT DOCUMENTS

| | | | |
|---|---|---|---|
| 4,279,717 A | 7/1981 | Eckberg et al. | |
| 4,310,469 A | 1/1982 | Crivello et al. | |
| 4,421,904 A | 12/1983 | Eckberg et al. | |
| 4,547,431 A | 10/1985 | Eckberg | |
| 4,952,657 A | 8/1990 | Riding et al. | |
| 5,057,549 A | 10/1991 | Herzig et al. | |
| 5,057,550 A * | 10/1991 | Lutz et al. | 522/148 |
| 5,217,805 A | 6/1993 | Kessel et al. | |
| 5,231,157 A | 7/1993 | Herzig et al. | |
| 5,279,860 A | 1/1994 | Griswold et al. | |
| 5,340,898 A | 8/1994 | Cavezzan et al. | |
| 5,360,833 A | 11/1994 | Eckberg et al. | |
| 5,468,890 A | 11/1995 | Herzig et al. | |
| 5,650,453 A | 7/1997 | Eckberg et al. | |
| 5,814,679 A * | 9/1998 | Eckberg et al. | 522/31 |
| 5,866,261 A | 2/1999 | Kerr, III et al. | |
| 5,973,020 A | 10/1999 | Kerr, III et al. | |
| 6,365,643 B1 | 1/2001 | Oestreich et al. | |
| 6,380,277 B1 | 1/2001 | Oestreich et al. | |

FOREIGN PATENT DOCUMENTS

| | | |
|---|---|---|
| EP | 0 334 056 A2 | 9/1989 |
| EP | 0 522 703 A2 | 1/1993 |
| GB | 1 516 352 | 7/1978 |

OTHER PUBLICATIONS

Crivello et al, vol. III Photoinitiators for Free Radical Cationic and Anionic Photopolymerisation, 2$^{nd}$ Edition, Chemistry and Technology of UV and EB Formulation for Coatings, Inks and Paints.

* cited by examiner

*Primary Examiner*—Kuo-Liang Peng
(74) *Attorney, Agent, or Firm*—Frommer Lawrence & Haug LLP

(57) ABSTRACT

The invention provides for the use of hydroxyl-functional polyalkylorganosiloxanes of the general formula (IV)

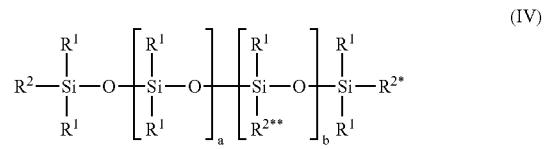

as solvents for cationic photoinitiators and for the use of these solutions in cationically curable silicones.

7 Claims, No Drawings

USE OF HYDROXYL-FUNCTIONAL POLYALKYLORGANOSILOXANES AS SOLVENTS FOR CATIONIC PHOTOINITIATORS FOR USE IN RADIATION- CURABLE SILICONES

RELATED APPLICATIONS

This application claims priority to German application Ser. No. 103 41 137.2, filed Sep. 6, 2003, herein incorporated by reference.

BACKGROUND OF THE INVENTION

1. Field of the Invention

The present invention relates to the use of hydroxyl-functional polyalkylorganosiloxanes as solvents for cationic photoinitiators and compositions comprising cationic photoinitiators, to hydroxyl-functional polyalkylorganosiloxanes as solvents and to their use in cationically radiation-curable silicones.

2. Description of Related Art

Since the 1980s cationically radiation-curing abhesive coating materials have been known on the market. They are composed of organopolysiloxanes which contain reactive groups and which cure under UV radiation by a cationic mechanism. Said reactive groups may be epoxy groups, vinyl ether groups or alkenyloxy groups such as vinyloxy groups or propenyloxy groups. Such substances are described for example in U.S. Pat. Nos. 5,057,549; 5,231,157; 4,421,904; 4,547,431; 4,952,657; 5,217,805; 5,279,860; 5,340,898; 5,360,833; 5,650,453; 5,866,261 and 5,973,020.

Cationic photopolymerization is a rapid, efficient and environmentally benign way to cure cationically polymerizable monomers. Particularly efficient photoinitiators are diaryliodonium salts (I) and triarylsulfonium salts (II)

$$Ar-I^+-Ar\ X^- \qquad (I)$$

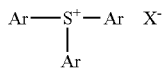

where Ar represents identical or different aromatic radicals which if desired may contain heteroatoms and/or further substituent radicals.

Diaryliodonium salts (I) in particular are known from the patent literature (GB-A-1 516 352, U.S. Pat. No. 4,279,717, EP-A-0 334 056, U.S. Pat. No. 5,468,890) and are used as photoinitiators for polymerizing cationically polymerizable substances.

One important requirement for the utility of the photoinitiators is their miscibility in the cationically radiation-curable organopolysiloxanes. In order to ensure such miscibility the photoinitiators are prepared or modified with a hydrophobic radical, as described for example in U.S. Pat. Nos. 4,310,469; 6,365,643 and 6,380,277.

In pure form, however, such photoinitiators are solids or at least waxlike or viscous compounds and hence are difficult to incorporate into cationically radiation-curable organopolysiloxanes. For example the commercially available cationic photoinitiator bis(dodecylphenyl)iodonium hexafluoroantimonate (III),

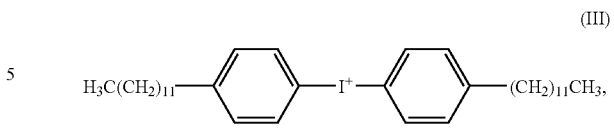

has a waxlike consistency at room temperature.

In order to ensure ease of incorporation of such photoinitiators into the cationically radiation-curable compositions, the photoinitiators are generally supplied in dissolved form. Used for this purpose are solvents such as toluene, xylene, isopropanol, propylene glycol, alkylphenols, propylene carbonate, glycidyl ethers and butyrolactone.

One important requirement for the utility of such solvents is that the cationic photoinitiators form clear solutions therein and form clear mixtures with the cationically radiation-curable organopolysiloxanes. With propylene carbonate, ethylene glycol or propylene glycol, for example, it is the case, however, that the frequently very hydrophobic cationically curable organopolysiloxanes are generally unable to form clear mixtures. Other solvents such as $C_{12}/C_{14}$ glycidyl ethers, for example, are environmentally hazardous.

Low molecular mass, highly volatile compounds in particular are of only limited suitability as solvents for the cationic photoinitiators, since they burden the environment by odors and/or volatile solvent constituents (VOCs, volatile organic compounds) and harbor the risk of formation of explosive gas mixtures.

In order to prevent the environment being burdened by odors and/or VOCs the aim is to use high-boiling solvents which additionally by way of functional groups can be incorporated into the cationically curable coating and hence do not remain as a migrateable constituent in the cured silicone release coating. High-boiling solvents of this kind may be, for example, alkylphenols or alkyl epoxides, as described in EP-A-0 522 703.

Particularly in the case of coatings produced from organopolysiloxanes containing epoxy groups, however, it is observed that polar solvents, such as isopropanol, propylene glycol and alkylphenols, may adversely affect the release activity of the organopolysiloxane coating. U.S. Pat. No. 4,954,364 describes for example the addition of alkylphenols to organopolysiloxanes containing epoxy groups as a controlled release additive (CRA) in order deliberately to detract from the release property of the organopolysiloxane coating. The addition of just 0.1 part of nonylphenol to the organopolysiloxane containing epoxy groups produces a doubling in the release force as compared with a nonylphenol-free coating. The release force (or release value) is the force required to peel the respective adhesive tape from the substrate. Generally speaking, however, the aim when using an organopolysiloxane coating is to obtain a very good release effect, i.e., low release force.

It is therefore desirable to find high-boiling solvents which do not burden the environment with odors and/or volatile solvent constituents (VOCs, volatile organic compounds) and which do not adversely affect the release activity of organopolysiloxane coatings.

A further important requirement for the utility of such solvents is that the mixtures of solvent and photoinitiator exhibit at least six months' storage stability. It is desirable, in other words, to find solvents which form clear solutions with the cationic photoinitiator and which have a storage stability of at least six months.

For the preparation of cationic photoinitiators, as described in applications U.S. Pat. Nos. 6,365,643 and 6,380,277, the substances used are in some cases toxic, corrosive and/or environmentally hazardous, such as isocyanates, acid chlorides or chlorosilanes, for example. For reasons of the reaction process these substances are used in excess, an excess which it is then impossible to remove sufficiently by distillation afterward, owing to the thermal lability of the iodonium salts.

It is therefore also desirable to find solvents which together with the remnant excesses are consumed by reaction to form nonhazardous, polymeric substances.

OBJECTS OF THE INVENTION

Therefore, it is an object of the present invention to provide solvents for diaryliodonium salts in particular as photoinitiators for the cationic curing of radiation-curable organopolysiloxanes, these solvents forming clear mixtures with the cationically curable organopolysiloxanes and having a storage stability of at least six months. The solvents reduce the burden on the environment due to odors and/or volatile solvent constituents (VOCs, volatile organic compounds), do not adversely affect the release activity of organopolysiloxane-based coatings, can be incorporated into the coating by polymerization and can react with excesses of reactive substances to form nonhazardous, polymeric compounds.

Surprisingly it has been found that the aforementioned object is achieved through the use of hydroxyl-functional polyalkylorganosiloxanes as solvents. Other objects include mixtures comprising these hydroxy-function polyalkyl organosiloxanes and cation photoinitiators. These and other objects will be apparent from the following Description of the Invention.

DESCRIPTION OF THE INVENTION

The invention therefore firstly provides mixtures which comprise:

A) hydroxyl-functional polyalkylorganosiloxanes of the general formula (IV)

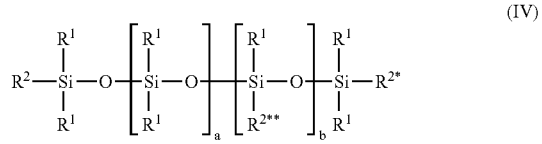

(IV)

where
a is from 0 to 200,
b is from 0 to 50,
$R^1$ is identical or different at each occurrence in the molecule and denotes alkyl radicals, preferably having from 1 to 4 carbon atoms,
$R^2$, $R^{2*}$ and $R^{2**}$ are identical or different and have the following definition:
  $R^{2a}$ independently at each occurrence denotes selected, optionally substituted alkyl radicals preferably having from 1 to 20 carbon atoms, optionally substituted aryl or aralkyl radicals,
  $R^{2b}$ independently at each occurrence denotes selected radicals of the general formula

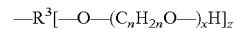

where
  $R^3$ is a z+1-valent hydrocarbon radical which optionally is substituted and/or contains ether bridges and preferably has from 2 to 20 carbon atoms or is an aryl radical or aralkyl radical which optionally is substituted and/or contains ether bridges,
n is 2, 3 or 4,
x is from 0 to 100,
z is from 1 to 6, with the proviso that in the average molecule in each case at least one radical $R^2$, $R^{2*}$, $R^{2**}$ has the definition $R^{2b}$, and B) at least one cationic photoinitiator.

The inventive mixtures can contain from about 1 weight % to 99 weight % of compound A and from about 99 weight % to about 1 weight % of component B, based upon total weight of the mixture provided that the resulting mixture is a liquid (flowable) at room temperature. Preferred amounts of component A are from about 10 weight % to about 90 weight %, with about 30 weight % to about 70 weight % being especially preferred.

This invention further provides for the use of the polyalkylorganosiloxanes of the formula (IV) as solvents for cationic photoinitiators.

The invention further provides mixtures consisting of

A) at least one hydroxyl-functional polyalkylorganosiloxane of the general formula (IV)

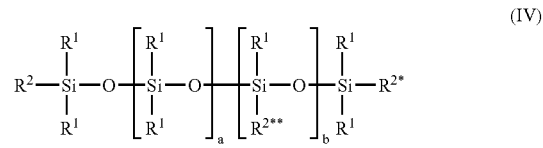

(IV)

where
a is from 0 to 200,
b is from 0 to 50,
$R^1$ is identical or different at each occurrence in the molecule and denotes alkyl radicals, preferably having from 1 to 4 carbon atoms,
$R^2$, $R^{2*}$ and $R^{2**}$ are identical or different and have the following definition:
  $R^{2a}$ independently at each occurrence denotes selected, optionally substituted alkyl radicals having from 1 to 20 carbon atoms, aryl or aralkyl radicals which optionally are substituted and/or contain ether bridges,
  $R^{2b}$ independently at each occurrence denotes selected radicals of the general formula

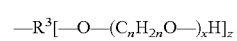

where
  $R^3$ is a z+1-valent hydrocarbon radical which optionally is substituted and/or contains ether bridges and preferably has from 2 to 20 carbon atoms or is an optionally substituted aryl radical or aralkyl radical,
n is 2, 3 or 4,
x is from 0 to 100,
z is from 1 to 6, with the proviso that in the average molecule in each case at least one radical $R^2$, $R^{2*}$, $R^{2**}$ has the definition $R^{2b}$, and B) at least one cationic photoinitiator, preferably diaryliodonium salts.

In one preferred embodiment of the present invention the hydroxyl-functional polyalkylorganosiloxanes are such that a is a number in the range from 5 to 100, in particular from 5 to 80, b is a number in the range from 0 to 10, in particular from 0 to 5, n is a number in the range from 2 to 3, x is a number in the range from 0 to 30, in particular from 0 to 10, z is a number from 1 to 3.

The values of the indices a, b and x are mean values, the respective increments being present in random or blockwise distribution in the molecule.

In the moiety $-R^3[-O-(C_nH_{2n}O-)_xH]_z$ it is possible for "n" identically or differently to adopt one or more of the values from 2 to 4, it being possible for the distribution within the range of repetition "x" to be blockwise or random.

Particular preference is given in accordance with the present invention to hydroxyl-functional polyalkylorganosiloxanes where the radical $R^1$ in the general formula (IV) is a methyl radical.

Examples of the radical $R^{2a}$ are alkyl radicals, such as the methyl, ethyl, butyl, dodecyl and/or hexadecyl radical; aryl radicals, such as the phenyl and/or naphthyl radical; and aralkyl radicals, such as the (methyl)ethylphenyl radical.

Examples of the radical $R^3$ are divalent alkyl radicals, such as $-CH_2-$, $-(CH_2)_2-$, $-(CH_2)_3-$, $-(CH_2)_4-$, $-(CH_2)_6^-$, $-(CH_2)_{10}-$, $-CH_2CH_2CH(OCH_3)CH_2-$; aryl radicals, such as the phenyl, naphthyl or anthryl radical; and aralkyl radicals, such as

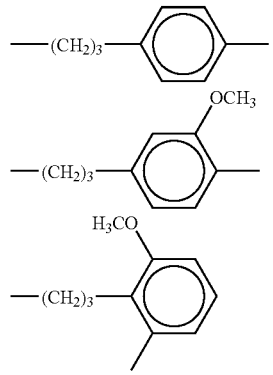

and radicals containing ether bridges, such as

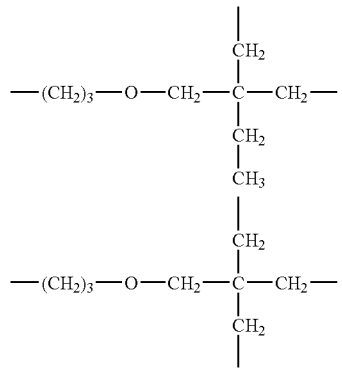

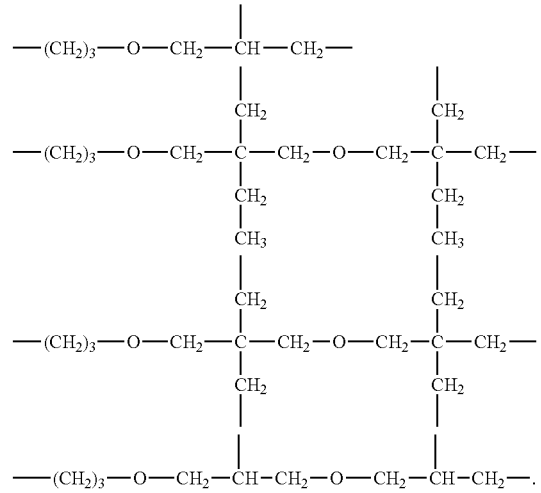

Particularly preferred examples of the radical $R^3$ are $-(CH_2)_3-$, $-(CH_2)_6-$,

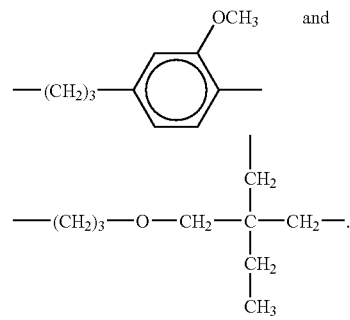

Examples of hydroxyl-functional polyalkylorganosiloxanes used in accordance with the invention are (Ex. 1)

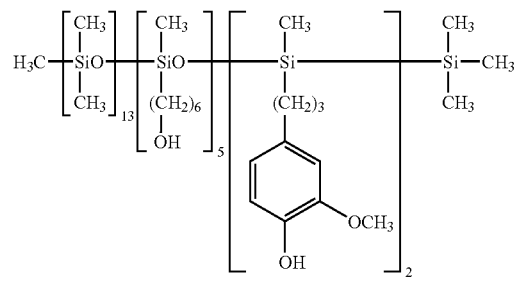

(Ex. 2)

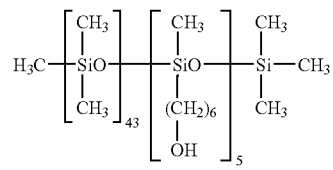

(Ex. 3)

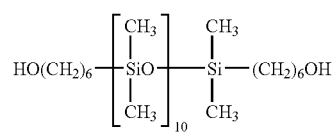

-continued

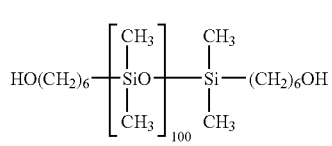
(Ex. 4)

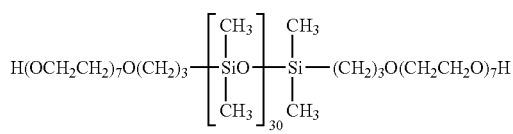
(Ex. 5)

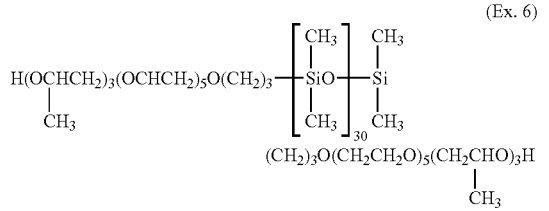
(Ex. 6)

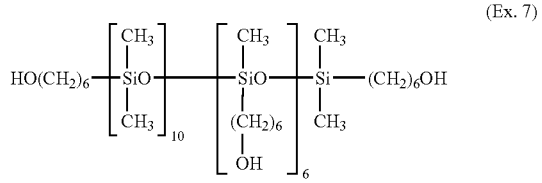
(Ex. 7)

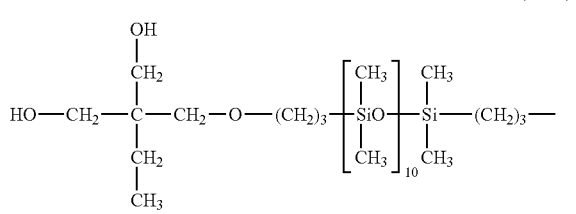
(Ex. 8)

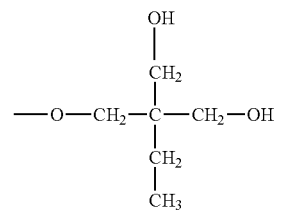
(Ex. 9)

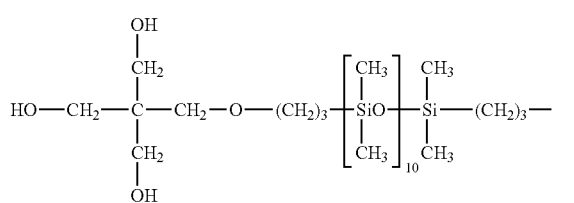

Cationic photoinitiators for the purposes of the present invention are diaryliodonium salts (I) and triarylsulfonium salts (II).

Examples of cationic photoinitiators in the sense of the present invention may be found in J. V. Crivello and K. Dietliker, Photoinitiators for Free Radical Cationic & Anionic Photopolymerisation 2nd Edition, John Wiley and Sons, New York, 1998, pp. 379-466 and in U.S. Pat. No. 6,365,643. The cationic photoinitiators preferred in accordance with the invention are diaryliodonium salts of the general formula (V):

$$Ar—I^+—Ar \ X^- \qquad (V)$$

in which

I is the element iodine,

Ar represents identical or different aromatic radicals which if desired may contain heteroatoms and/or further substituent radicals and $X^-$ is the anion of a complex metal salt or of a strong acid.

Particularly preferred examples of diaryliodonium salts in the sense of the present invention are

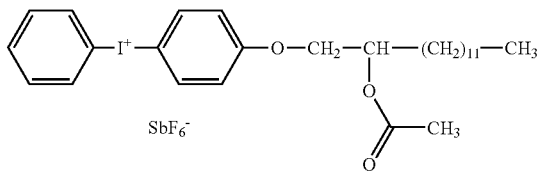
(Ex. 10)

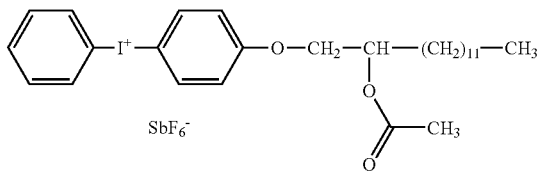
(Ex. 11)

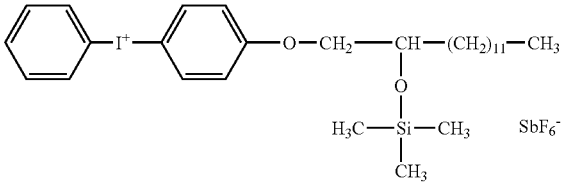
(Ex. 12)

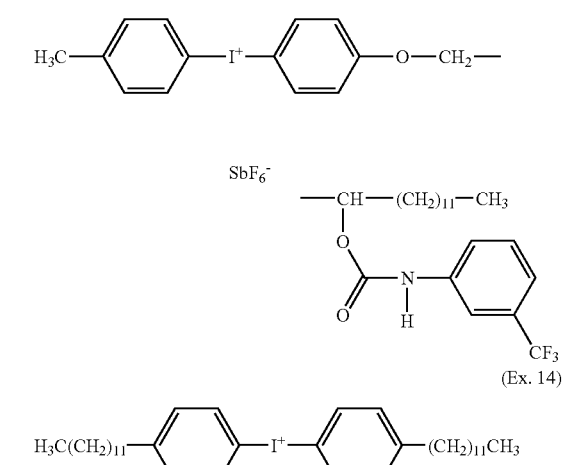
(Ex. 13)

(Ex. 14)

SbF$_6^-$

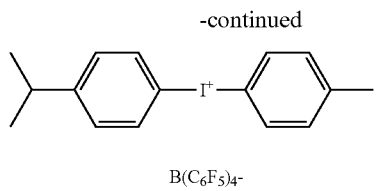

(Ex. 15)

B(C₆F₅)₄⁻

Comparative Experiments:

The solution behavior of the hydroxy-functional polyalkylorganosiloxanes used in accordance with the invention was compared with that of noninventive compounds. For this purpose, 50% by weight each of solvent and of diaryliodonium salt were mixed with one another and the storage stability (180 days at 25° C.) of the mixture was observed. The results are summarized in Table 1:

TABLE 1

| Solvent | Diaryliodonium salt | Solution after 1 day | Solution after 180 days |
|---|---|---|---|
| Toluene | Ex. 10 | cloudy | two phases |
| Toluene | Ex. 11 | clear | two phases |
| Toluene | Ex. 12 | clear | two phases |
| Toluene | Ex. 13 | clear | clear |
| Isopropanol | Ex. 10 | clear | clear |
| Dodecylphenol | Ex. 13 | clear | clear |
| Polyethylene glycol 200 | Ex. 10 | clear | clear |
| Silicone oil 100 | Ex. 12 | cloudy | two phases |
| C₁₂/C₁₄ glycidyl ether | Ex. 14 | clear | clear |
| Propylene carbonate | Ex. 14 | clear | clear |
| Ex. 1 | Ex. 10 | clear | clear |
| Ex. 2 | Ex. 13 | clear | clear |
| Ex. 3 | Ex. 13 | clear | clear |
| Ex. 4 | Ex. 15 | clear | clear |
| Ex. 5 | Ex. 14 | clear | clear |
| Ex. 6 | Ex. 11 | clear | clear |
| Ex. 7 | Ex. 13 | clear | clear |

It is apparent that the hydroxy-functional polyalkylorganosiloxanes used in accordance with the invention form clear solutions with diaryliodonium salts and produce solutions which are still stable even after a 180-day storage period.

In order to determine the burden on the environment as a result of odors and/or volatile solvent constituents (VOCs, volatile organic compounds) 4% by weight of a photoinitiator solution composed of 50% by weight solvent and 50% by weight photoinitiator were mixed with 96% by weight of a cycloaliphatic epoxy silicone having a viscosity of 125 mPas and an epoxy value of 3.5% and the mixture was then applied using a five-roll applicator in a pilot plant to a standard BOPP (biaxially oriented polypropylene) film. The application weight was 1 g/m². The coating was subsequently cured using a microwave-excited UV lamp (Fusion, 120 W/cm) at a speed of 20 m/min.

The odor of the coated film was determined immediately following its departure from the UV lamp. The results are summarized in Table 2.

TABLE 2

| Solvent | Diaryliodonium salt | Odor |
|---|---|---|
| Toluene | Ex. 10 | toluene (severe) |
| Toluene | Ex. 11 | toluene (severe) |
| Toluene | Ex. 12 | toluene (severe) |
| Toluene | Ex. 13 | toluene (severe) |
| Isopropanol | Ex. 10 | isopropanol |
| Dodecylphenol | Ex. 13 | neutral |

TABLE 2-continued

| Solvent | Diaryliodonium salt | Odor |
|---|---|---|
| Polyethylene glycol 200 | Ex. 10 | neutral |
| Silicone oil 100 | Ex. 12 | neutral |
| C₁₂/C₁₄ glycidyl ether | Ex. 14 | acrid |
| Propylene carbonate | Ex. 14 | neutral |
| Ex. 1 | Ex. 10 | neutral |
| Ex. 2 | Ex. 13 | neutral |
| Ex. 3 | Ex. 13 | neutral |
| Ex. 4 | Ex. 15 | neutral |
| Ex. 5 | Ex. 14 | neutral |
| Ex. 6 | Ex. 11 | neutral |
| Ex. 7 | Ex. 13 | neutral |

It is apparent that the hydroxyl-functional polyalkylorganosiloxanes used in accordance with the invention have a significantly improved odor as compared with the noninventive solvents, particularly toluene and isopropanol.

The hydroxyl-functional polyalkylorganosiloxanes have the capability to act as chain transfer agents in accordance with the following mechanism (VI)

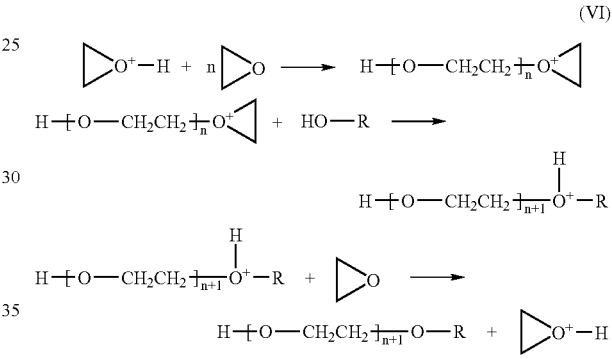

(VI)

(J. V. Crivello, S. Liu, Journal of Polymer Science: Part A: Polymer Chemistry, Vol. 38, 389-401 (2000)) in the cationic polymerization of cationically polymerizable compositions—in this case epoxides—and hence to be incorporated into the coating in the course of cationic curing.

The skilled worker is aware that the hydroxyl-functional polyalkylorganosiloxanes can react with reactive compounds, such as isocyanates, acid chlorides and/or chlorosilanes, to form less harmful compounds. For example, following the preparation of the diaryliodonium salt (Ex. 13), the hydroxyl-functional polyalkylorganosiloxane (Ex. 2) is able to react with the excess (trifluoromethyl)phenyl isocyanate to form a harmless urethane.

In order to determine the effect of the solvent used on the release properties of organopolysiloxane-based release coatings, 4% by weight of a photoinitiator solution consisting of 50% by weight solvent and 50% by weight photoinitiator was mixed with 96% by weight of a cycloaliphatic epoxy silicone having a viscosity of 300 mPas (25° C.) and an epoxy value of 1.36%. The mixture was evaluated for clouding as a sign of incompatibilities. The mixture was then applied to a standard BOPP film using a five-roll applicator in a pilot plant. The application weight was 0.5 to 1.0 g/m². The coating was subsequently cured using a microwave-excited UV lamp (Fusion, 120 W/cm) at a speed of 20 m/min.

(A) The release value of the release coatings was determined in accordance with FINAT Test Method 10. This test is carried out using the commercially available adhesive tape (25 mm wide) TESA® 7476 from Beiersdorf. In order to measure the abhesiveness, these adhesive tapes are rolled onto the release coating and subsequently stored at 40° C. under a weight of 70 g/cm². After 24 hours a measurement is made of the force required to peel the respective adhesive tape from the substrate at a peel angle of 180° and at a peel rate of 30 cm/min. This force is termed the release force or release value.

(B) The subsequent adhesion is determined largely in accordance with FINAT Test Method 11. For this purpose the adhesive tape TESA® 7475 from Beiersdorf was rolled onto the release coating and then stored at 40° C. under a weight of 70 g/cm². After 24 hours the adhesive tape was separated from the release substrate and rolled onto a defined substrate (steel plate). After one minute a measurement was made of the force required to peel the adhesive tape from the substrate at a peel angle of 180° and at a peel rate of 30 cm/min. The value thus measured was divided by the value given by an untreated adhesive tape under otherwise identical test conditions. The result was termed the subsequent adhesion and is generally indicated as a percentage. Figures of more than 80% are considered by the skilled worker to be adequate, and suggest effective curing.

The results are summarized in Table 3.

TABLE 3

| No. | Solvent | Diaryl-iodonium salt | Mixture with epoxy silicone | Release force (cN/inch) Method (A) | Subsequent adhesion (%) Method (B) |
|---|---|---|---|---|---|
| 1 | Toluene | Ex. 10 | cloudy | 40 | 70 |
| 2 | Toluene | Ex. 11 | cloudy | 35 | 72 |
| 3 | Toluene | Ex. 12 | clear | 55 | 85 |
| 4 | Toluene | Ex. 13 | clear | 57 | 88 |
| 5 | Isopropanol | Ex. 10 | cloudy | 45 | 69 |
| 6 | Dodecylphenol | Ex. 13 | clear | 92 | 89 |
| 7 | Polyethylene glycol 200 | Ex. 10 | cloudy | 47 | 73 |
| 8 | Silicone oil 100 mPa · s | Ex. 12 | cloudy | 40 | 65 |
| 9 | $C_{12}/C_{14}$ glycidyl ether | Ex. 14 | clear | 55 | 88 |
| 10 | Propylene carbonate | Ex. 14 | cloudy | 52 | 90 |
| 11 | Ex. 1 | Ex. 14 | clear | 56 | 87 |
| 12 | Ex. 2 | Ex. 13 | clear | 58 | 88 |
| 13 | Ex. 3 | Ex. 13 | clear | 57 | 90 |
| 14 | Ex. 4 | Ex. 15 | clear | 52 | 91 |
| 15 | Ex. 5 | Ex. 14 | clear | 50 | 89 |
| 16 | Ex. 6 | Ex. 14 | clear | 59 | 91 |
| 17 | Ex. 7 | Ex. 13 | clear | 58 | 90 |

Low release values and low subsequent adhesion indicate poor curing of the silicones or migrateable constituents in the coating. This is the case for experiments 1, 2, 5 and 7, owing to the partial incompatibility of the photocatalyst with the epoxy silicone, and in experiment 8, owing to the migrateable solvent (silicone oil, viscosity of 100 mPa·s).

Release values of around 50-60 cN/in in conjunction with good subsequent adhesion point to a good-quality release coating. The release properties of organopolysiloxane-based release coatings are not adversely affected by the use of hydroxyalkylpolydimethylsiloxanes as solvents for diaryliodonium salts as compared with the prior art mentioned at the outset.

The hydroxyalkylpolydimethylsiloxanes used in accordance with the invention are suitable for use as polymeric solvents for photoinitiators for polymerizing cationically polymerizable organopolysiloxanes.

The above description is intended to be illustrative and not limiting. Various changes in the embodiments described herein may occur to those skilled in the art. These changes can be made without departing from the scope or spirit of the invention.

The invention claimed is:

1. A mixture comprising:

A) at least one hydroxyl-functional polyalkylorganosiloxanes selected from the group consisting of:

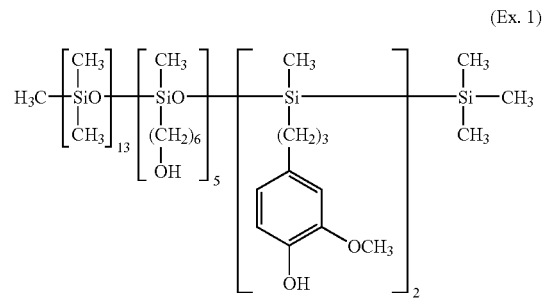

(Ex. 1)

-continued

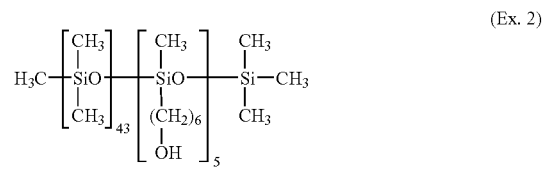

(Ex. 2)

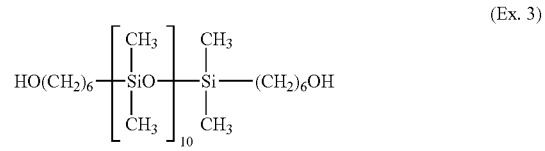

(Ex. 3)

-continued (Ex. 4)
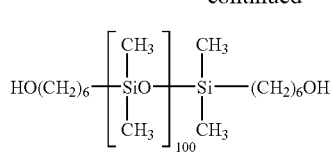

(Ex. 5)
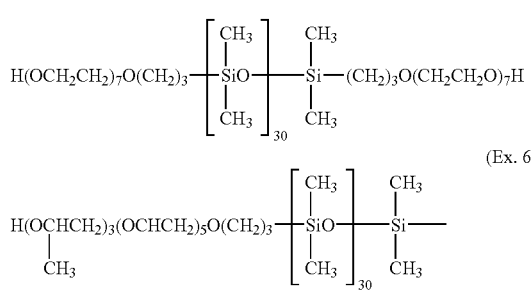

(Ex. 6)
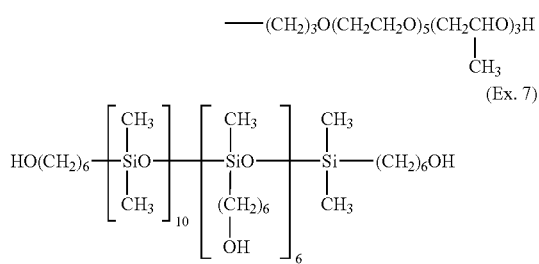

(Ex. 7)
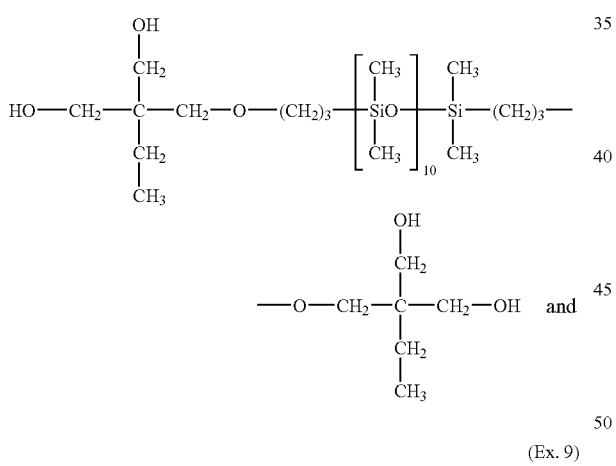

(Ex. 8)
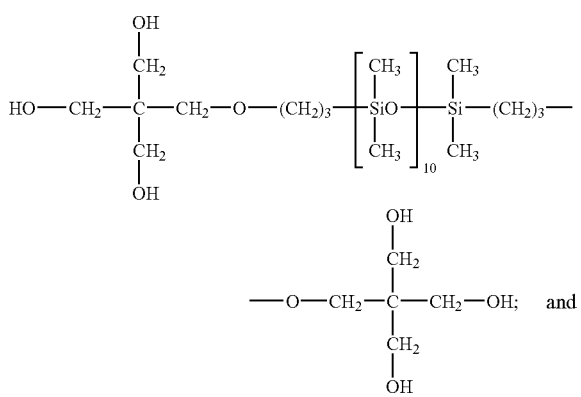

(Ex. 9)

B) at least one cationic photoinitiator.

2. The mixture as claimed in claim 1, wherein the cationic photoinitiator is a diaryliodonium salt.

3. The mixture as claimed in claim 2, wherein the diaryliodonium salts is a compound selected from the group consisting of

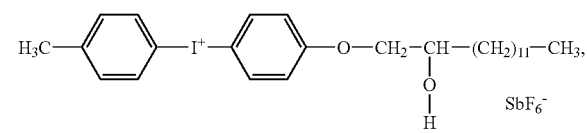

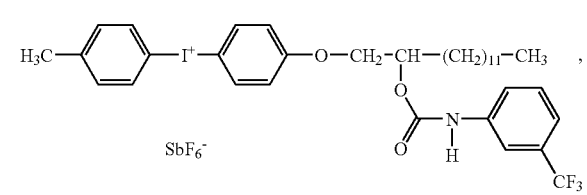

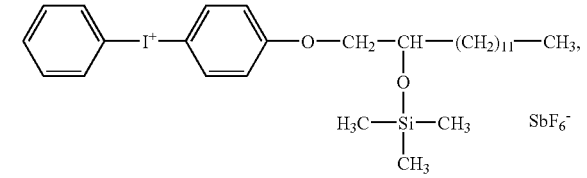

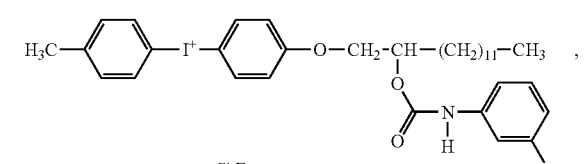

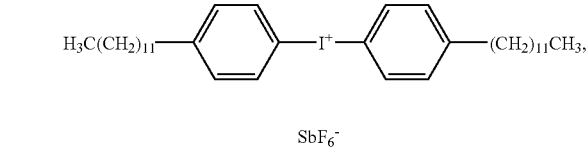

and

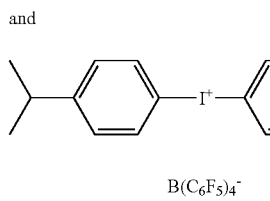

$B(C_6F_5)_4^-$

4. The mixture as claimed in claim 1, wherein the cationic photoinitiator is a triarylsulfonium salt.

5. A cationically curable composition which comprises at least one organopolysiloxanes, which contains at least one UV reactive group and that cures cationically under UV radiation, and the mixture according to claim 1.

6. An adhesive coating which is obtained by reacting the cationically curable composition according to claim 1 with UV light.

7. A method for increasing the storage shelf life of a solution comprising of at least one cationic photoinitiator which comprises dissolving the cationic photoinitiator in a solvent comprising at least one hydroxyl-functional polyalkylorganosiloxanes selected from the group consisting of:

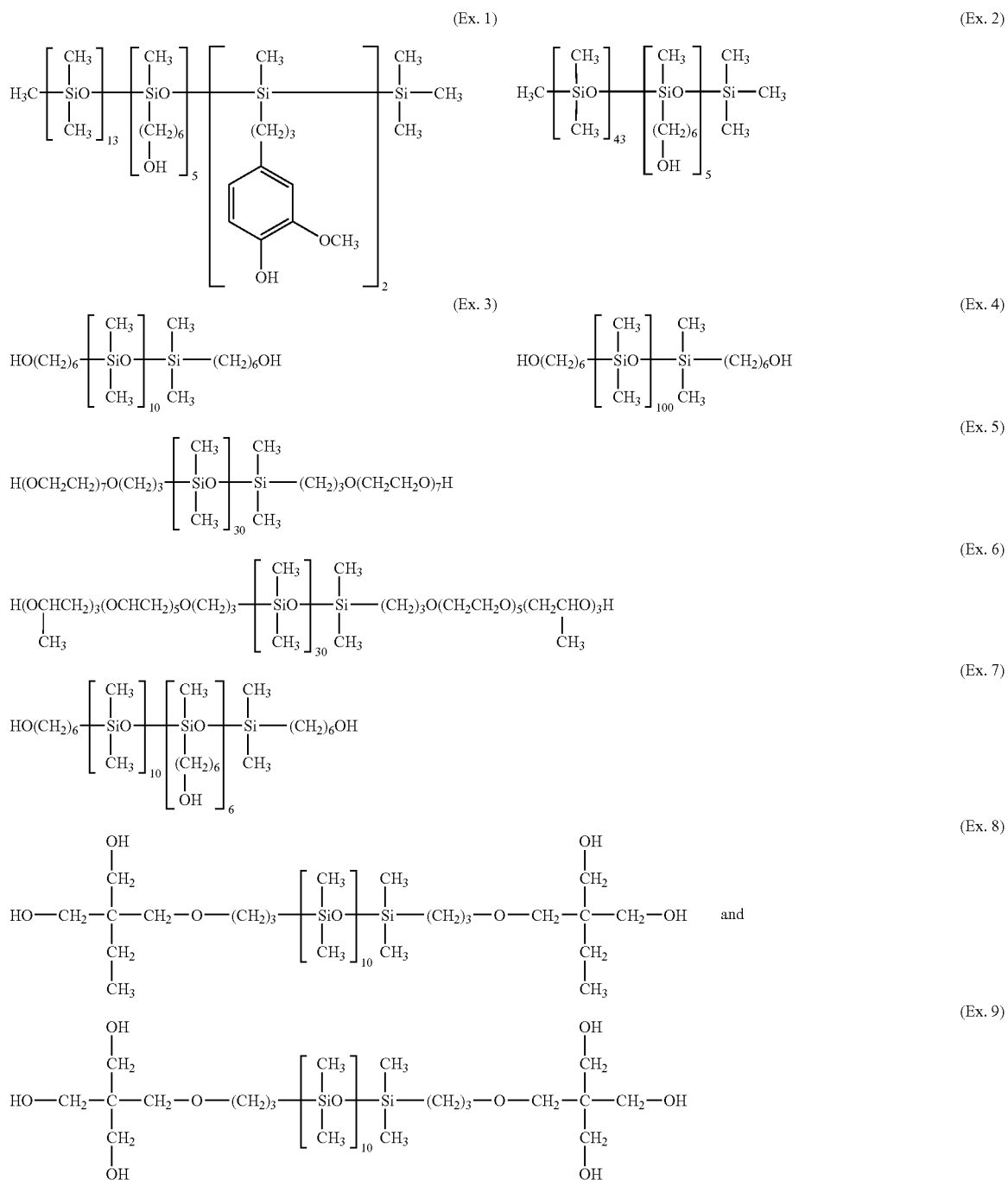
as a solvent for cationic photoinitiators whereby the solution is stable for at least six months.
* * * * *